United States Patent
Bouaricha

(10) Patent No.: US 8,209,154 B2
(45) Date of Patent: Jun. 26, 2012

(54) HYBRID TIME AND FREQUENCY SOLUTION FOR PLL SUB-BLOCK SIMULATION

(75) Inventor: Ali Bouaricha, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 680 days.

(21) Appl. No.: 12/112,966

(22) Filed: Apr. 30, 2008

(65) Prior Publication Data

US 2009/0276195 A1    Nov. 5, 2009

(51) Int. Cl.
*G06F 7/60* (2006.01)
*G06F 17/10* (2006.01)

(52) U.S. Cl. .......................................................... 703/2
(58) Field of Classification Search ........................ 703/2
See application file for complete search history.

(56) References Cited

U.S. PATENT DOCUMENTS

| 6,687,658 | B1 * | 2/2004 | Roychowdhury | 703/2 |
| 7,480,879 | B2 * | 1/2009 | Checka et al. | 716/5 |
| 2007/0100596 | A1 * | 5/2007 | Hollis | 703/14 |
| 2010/0198575 | A1 * | 8/2010 | Hollis | 703/14 |
| 2010/0286807 | A1 * | 11/2010 | Chen | 700/97 |

* cited by examiner

*Primary Examiner* — David Silver
(74) *Attorney, Agent, or Firm* — Fenwick & West LLP

(57) ABSTRACT

A system for a fast method to simulate phase lock loop (PLL) sub-block simulation is presented. The simulation of the sub-blocks of the PLL involve solving a system of non-linear equations for the voltages and currents in the sub-blocks of the PLL. A harmonic balance method is used to solve the system of non-linear equation. The harmonic balance method involves creating a system of linear equations which is solved using a novel hybrid time and frequency domain preconditioner. The hybrid time and frequency domain preconditioner includes the strong and fast convergence property of time-domain preconditioning while avoiding the potential divergent problems of time-domain preconditioning. In addition the hybrid time and frequency domain preconditioner also includes the dependable convergence of frequency domain preconditioning while avoiding the potential stalling problems of frequency domain preconditioning.

21 Claims, 5 Drawing Sheets

HYBRID TIME AND FREQUENCY SOLUTION FOR PLL SUB-BLOCK SIMULATION

BACKGROUND

1. Field of the Invention

The invention relates to simulation of semiconductor chips. More specifically, the invention relates to a method and an apparatus for simulating phase lock loops (PLLs) in integrated circuits.

2. Related Art

Most integrated circuits include one or more phase locked loops (PLL) for clock synthesis, clock and data recovery circuits, or frequency synthesis circuits. When integrated circuits ran at relatively low frequencies (clock speeds), timing jitters within the PLLs were not significant and were generally ignored. However, with increasing frequency as well as larger process variation (from advanced manufacturing techniques), the timing jitters of PLLs have become problematic. Specifically, the timing jitters may cause failure of an integrated circuit for various timing issues. Thus, to properly simulate an integrated circuit the timing jitters of any phase locked loops within the integrated circuit must also be accurately simulated.

Phase lock loops are too complicated to be simulated directly. Thus, analysis and simulation of phase locked loops are performed by dividing the PLL into functional sub-blocks. Because timing jitters are related to phase noise, the phase noise of each sub-block of the PLL is computed separately. The phase noise of the sub-blocks are then combined to obtain the phase noise of the PLL. The phase noise of the PLL is then converted to PLL timing jitter values.

FIG. 1(a) illustrates the functional sub-block of a phase locked loop 120 and a reference oscillator 110. Specifically, the functional sub-blocks of phase locked loop 120 include a phase detector 121, a charge pump 123, a loop filter 125, a voltage controlled oscillator 127, and a divider 129. The construction and function of phase locked loops are well known thus, only a brief functional description of phase locked loop 120 is provided. Specifically, reference oscillator 110 provides an input clock signal IN to phase locked loop 120, which generates an output clock signal OUT having a frequency that is N (an integer) times greater than the frequency of input clock signal IN. Internally, output signal OUT is divided by DIVIDER 129 to produce clock signal OUT/N, which has a frequency equal to the frequency of output clock signal OUT divided by N. Phase detector 121 receives both input clock signal IN and clock signal OUT/N. Phase detector 121 controls charge pump 123 based on whether the clock edges of clock signal OUT/N are ahead or behind the clock edges of input clock signal CLK. Charge pump 123 controls voltage controlled oscillator 127 through loop filter 125. When the clock edge of clock signal OUT/N is ahead of the clock edge of input clock signal IN, phase detector 121 causes charge pump 123 to decrease the frequency of voltage controlled oscillator 127. Conversely, when the clock edge of clock signal OUT/N is behind the clock edge of input clock signal IN, phase detector 121 causes charge pump 123 to increase the speed of voltage controlled oscillator 127. Thus, the frequency of output clock signal OUT is maintained at approximately N times the frequency of input signal IN.

However, the method of calculating timing jitter described above fails when the phase noise simulation of any sub-block fails. Many sub-blocks of the PLL are very difficult to simulate. In general "digital circuits" having input/output waveforms with sharp transitions and/or sharp corners are difficult to simulate. Thus, phase detectors, frequency dividers (with high divide-by ratios) as well as voltage controlled oscillators in combination with frequency dividers are the most difficult to simulate.

In general, the simulation of the sub-blocks of the PLL involve solving a system of non-linear equations for the voltages and currents in the sub-blocks of the PLL. The method to create the system of non-linear equations for a particular PLL is well known and not described herein. For example, Phase-Locked Loops: Theory and Applications by John L. Stensby, (1997) describes the process for creating the system of non-linear equations for a PLL. In general, the system of non-linear equations represent Kirchhoff's current law in the frequency domain, which states that the sum of the currents entering a node equal the sum of the currents exiting the node. Solving the system of non-linear equation involves finding a residual value (i.e. the amount by which Kirchhoff's current law is violated) to a satisfactorily low level.

A harmonic balance method is used to solve the system of non-linear equation. FIG. 1(b) illustrates harmonic balance system 150 having a linear system construction unit 153, a preconditioner 155, a linear system solver 157, and a non-linear system calculation unit 159. Harmonic balance system 150 receives a system of non-linear equations 151 representing the PLL sub-block being simulated and produces solution 160 using a dual iterative method. Harmonic balance systems are well known in the art and thus only described briefly herein. Specifically, linear system construction unit 153 uses Newton's method to construct a system of linear equations, which are used to calculate the Fourier coefficients of the solution for the system of non-linear equations. Newton's method is an iterative process that begins with an initial guess and tries to converge to a solution. Specifically, if the system of non-linear equations is represented by $F(x)=0$, where F is a matrix, and x is a vector. The system of linear equations used in the Newton method is $J*d=-F$, where J is a Jacobian matrix that is the first derivative of $F(x)$, F is the residual and d is the Newton correction vector, which must be derived. For clarity and ease of understanding the system of linear equations is represented as $A*x=b$, where A is the Jacobian Matrix J, b is equal to $-F$, and x is a vector equivalent to the vector d.

The system of linear equations is solved using an internal iterative solver (typically a Krylov Solver, such as the generalized minimal residual method (GMRES)) represented by linear system solver 157. Linear system solver 157 attempts to calculate the vector x that satisfies the equation $A*x=b$; by calculating an approximation vector x_app, so that a residual is lower than a linear system accuracy threshold LSAT. Specifically the residual for linear system solver 157 is equal to the norm of $A*x\_app-b$. However, linear system solver 157 may not be able to solve or would take too long to solve most of system of linear equations generated by Newton's method. Thus, a preconditioner 155 conditions the system of linear equations to assist linear system solver 157. Specifically, preconditioner 155 creates a first preconditioned set of linear equations and linear system solver 157 generates an approximate solution to the first preconditioned set of linear equations. Then preconditioner 155 and linear system solver 157 and repeatedly generates approximate preconditioned sets of linear equations and generates approximate solutions for each preconditioned sets of linear equations to converge on a adequate solution to a preconditioned set of linear equations. The solution is then converted into a solution to the set of linear conditions (non-preconditioned). If an appropriate vector x, is found, linear system solver 157 provides the vector x to non-linear system calculation unit 159 which uses vector x to generate an approximate solution to the system of nonlinear equations. If the approximate solution satisfies a non-linear system accuracy threshold NLSAT than the approximate solution is provided as solution 160. Otherwise, the approximate solution is used as the starting point for another iteration by linear system construction unit 153. However, even with preconditioner 155, linear system solver 157 might still not be able to solve the system of linear equations in a reasonable amount of time.

As explained above, the digital sub-blocks of phase lock loops are extremely difficult to simulate. The difficulty results in very slow convergence or even divergence in linear system solver 157 even with the assistance of preconditioner 155. Hence there is a need for a method and system for rapidly simulating phase locked loops.

SUMMARY

Accordingly, the present invention provides a fast method and system to simulate the phase noise of phase locked loops by solving the complex systems of non-linear equations representing the phase locked loops. Specifically, the present invention uses a harmonic balance system that includes a novel hybrid time and frequency domain preconditioner. The hybrid time and frequency domain preconditioner includes the strong and fast convergence property of time-domain preconditioning while avoiding the potential divergent problems of time-domain preconditioning. In addition the hybrid time and frequency domain preconditioner also includes the dependable convergence of frequency domain preconditioning while avoiding the potential stalling problems of frequency domain preconditioning.

In one embodiment of the present invention, the system for simulating phase noise generates a system of non-linear equations representing the circuit and then constructs an unconditioned system of linear equations from the system of non-linear equations. The system determines whether to start with time domain preconditioning or frequency domain preconditioning by calculating the residual of the unconditioned system of linear equations. If the residual is less than an initial domain selection threshold, time domain preconditioning is used initially. Otherwise, frequency domain preconditioning is used initially.

For time domain preconditioning, the system generates a first plurality of time-domain preconditioned systems of linear equations. For each time-domain preconditioned system of linear equation, the system generates a time-domain preconditioned approximate solution until a satisfactory solution is reached of the approximate solutions begin to diverge. If the approximate solutions begin to diverge the system switches to frequency domain preconditioning.

For frequency domain preconditioning, the system generates a first plurality of frequency-domain preconditioned systems of linear equations. For each frequency domain-preconditioned system of linear equations, the system generates a frequency-domain preconditioned approximate solution until a satisfactory solution is reached or the approximate solutions begin to stall. If the approximate solutions begin to stall, the system switches to time domain preconditioning.

After an approximated solution is found for the preconditioned systems of linear equation, the system generates an approximate solution to the unconditioned system of linear equations. The approximate solution to the unconditioned set of linear equations is used to generate an approximate solution to the system of non-linear equations. If the approximate solution to the system of non-linear equations is not satisfactory then the system constructs another system of unconditioned linear equations to iteratively solve the system of non-linear equations.

The present invention will be more fully understood in view of the following description and drawings.

DETAILED DESCRIPTION

Figure 1A:
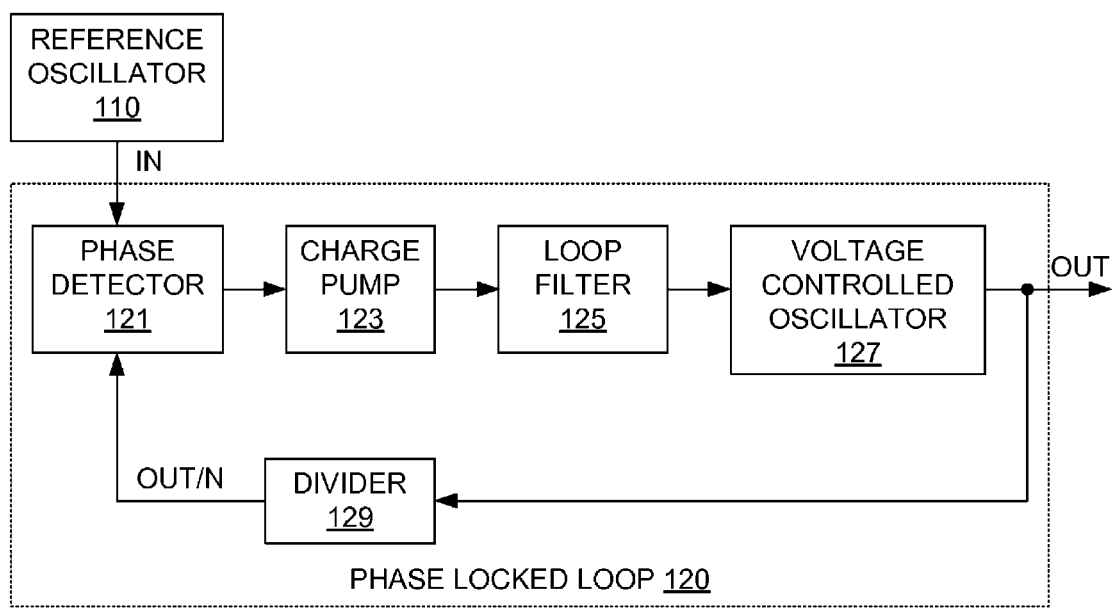
FIG. 1(a) is a simplified diagrams of a phase locked loop.
Figure 1B:
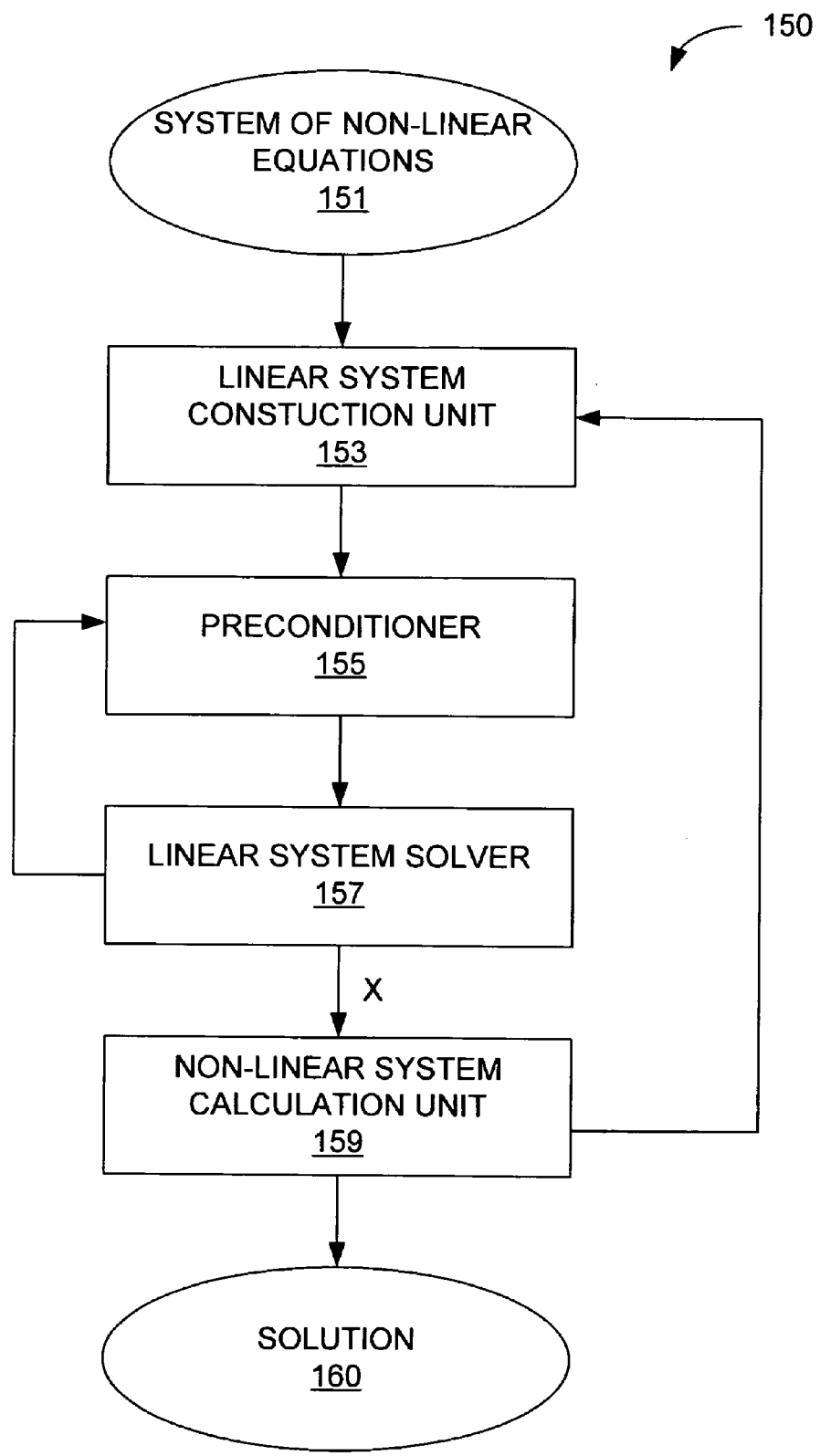
FIG. 1(b) is a simplified diagram of a harmonic balance system.
Figure 2:
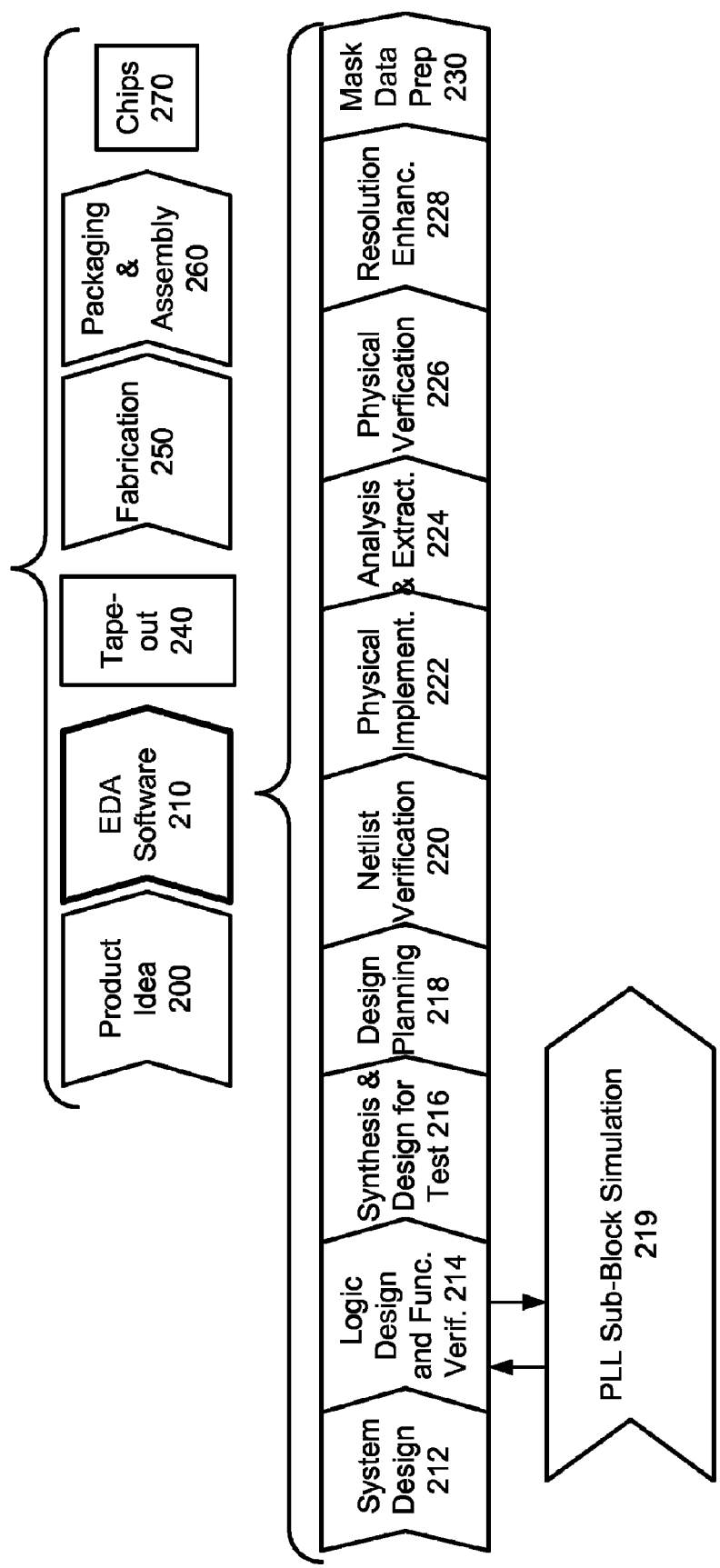
FIG. 2 is a simplified representation of an exemplary digital IC design flow in accordance with one embodiment of the present invention.

It may be helpful to place the processes of this invention in context of the overall chip design. FIG. 2 shows a simplified representation of an exemplary digital IC design flow. At a high level, the process starts with the product idea (200) and is realized in a EDA software design process (210). When the design is finalized, it can be taped-out (event 240). After tape out, the fabrication process (250) and packaging and assembly processes (260) occur resulting, ultimately, in finished chips (result 270).

The EDA software design process (210) is actually composed of a number of stages 212-230, shown in linear fashion for simplicity. In an actual IC design process, the particular design might have to go back through steps until certain tests are passed. Similarly, in any actual design process, these steps may occur in different orders and combinations. This description is therefore provided by way of context and general explanation rather than as a specific, or recommended, design flow for a particular IC. A brief description of the components of the EDA software design process (stage 210) will now be provided.

System design (stage 212): The circuit designers describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 214): At this stage, the VHDL or Verilog code for modules in the system is written and the design (which may be of mixed clock domains) is checked for functional accuracy. More specifically, the design is checked to ensure the design produces the correct outputs. The present invention is generally implemented in PLL Sub-Block Simulation 219, which is part of the logic design and functional verification (stage 214). Exemplary EDA software products from Synopsys, Inc. that can be used at this stage include VCS, VERA, DesignWare®, Magellan, Formality, ESP and LEDA products.

Synthesis and design for test (stage 216): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products.

Design planning (stage 218): Here, an overall floorplan for the chip is constructed and analyzed for timing and top-level routing. Exemplary EDA software products from Synopsys, Inc. that can be used at this stage include Jupiter and Floorplan Compiler products. Although circuitry and portions thereof (such as standard cells) are described herein as if they exist in the real world, it is to be understood that at this stage only a computer model exists in a programmed computer. The actual circuitry in the real world is created after this stage.

Netlist verification (stage 220): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime products.

Physical implementation (stage 222): The placement (positioning of circuit elements) and routing (connection of the same) occurs at this step. Exemplary EDA software products from Synopsys, Inc. that can be used at this stage include the Astro product.

Analysis and extraction (stage 224): At this step, the circuit function is verified at a transistor level, this in turn permits what-if refinement. Exemplary EDA software products from Synopsys, Inc. that can be used at this include Star RC/XT, Raphael, and Aurora products.

Physical verification (stage 226): At this stage various checking functions are performed to ensure correctness for: manufacturing, electrical issues, lithographic issues, and circuitry. Exemplary EDA software products from Synopsys, Inc. that can be used at this include the Hercules product. Conventional systems may perform hot spot detection after resolution enhancement 228 (as explained above) or would require design rules tailored to the RET/OPC process for the specific foundry performing fabrication 250.

Resolution enhancement (stage 228): This stage involves geometric manipulations of the layout to improve manufacturability of the design. Exemplary EDA software products from Synopsys, Inc. that can be used at this include iN-Phase, Proteus, and AFGen products.

Mask data preparation (stage 230): This stage provides the "tape-out" data for production of masks for lithographic use to produce finished chips. Exemplary EDA software products from Synopsys, Inc. that can be used at this stage include the CATS(R) family of products.

Figure 3:
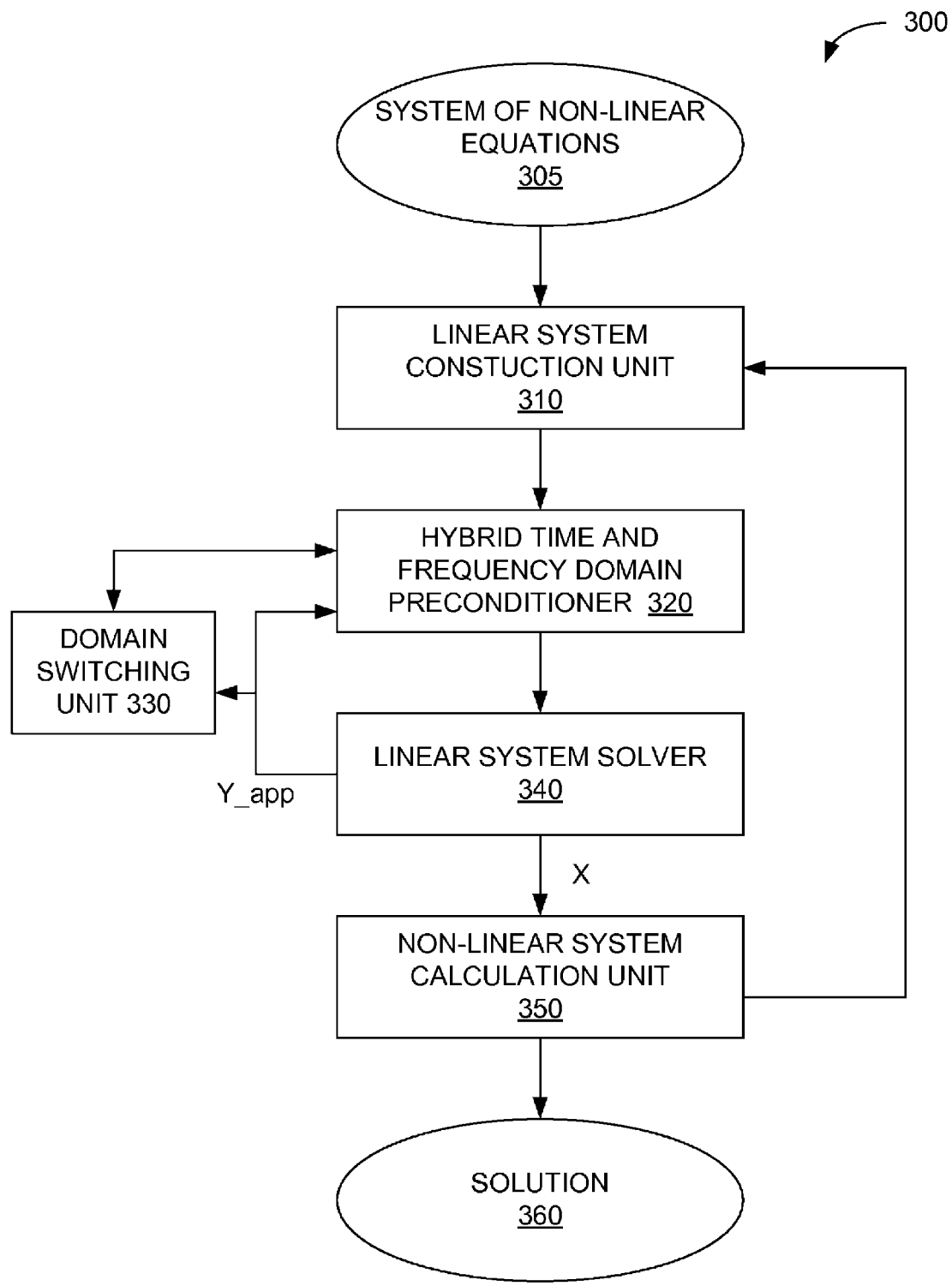
FIG. 3 is simplified diagram of a harmonic balance system in accordance with one embodiment of the present invention. a flow chart of one embodiment of the present invention.

FIG. 3 is a simplified diagram of a harmonic balance system 300 in accordance with one embodiment of the present invention. Harmonic balance system 300 includes a linear system construction unit 310, a hybrid time and frequency domain preconditioner 320, a domain switching unit 330, a linear system solver 340, and a non-linear system calculation unit 350. Harmonic balance system 300 receives a system of non-linear equations 305 and produces a solution 360 using a dual iterative method. Specifically, linear system construction unit 310 constructs a system of linear equations (represented as $A*x=b$), which is used to calculate the solution for the system of non-linear equations. For clarity, system of linear equations (represented as $A*x=b$) is hereinafter referred to as the "unconditioned system of linear equations" due to the use of "preconditioned system of linear equations" as described below. Generally, linear system construction unit 310 would use Newton's method as described above. Harmonic balance system 300 includes a novel hybrid time and frequency preconditioner 320 that uses both time domain techniques and frequency domain techniques to condition the unconditioned system of linear equations for a linear system solver 340. A domain switching unit 330 monitors the progress of linear system solver 340 to determine whether hybrid time and frequency domain preconditioner 320 should use time domain preconditioning techniques or frequency domain preconditioning techniques. Linear system solver 340 with the assistance of hybrid time and frequency domain preconditioner 320 uses an iterative approach to solve the system linear equations. Generally, linear system solver 340 attempts to calculate the vector x that satisfies the equation $A*x=b$. Linear system solver provides an approximate answer by calculating an approximation vector x_app, that satisfies a linear system accuracy threshold LSAT. Specifically, If the residual of the unconditioned system of linear equations using approximation vector x_app is lower than linear system accuracy threshold LSAT, then the last approximation is used as the solution vector X, which is provided to non-linear system calculation unit 350, which uses vector x to generate an approximate solution to the system of non-linear equations. If the approximate solution satisfies a non-linear system accuracy threshold NLSAT than the approximate solution is provided as solution 360. Otherwise, the approximate solution is used as the starting point for another iteration by linear system construction unit 310. Conventional linear system construction units, linear system solvers and non-linear system calculation units can be used in harmonic balance system 300.

More specifically, hybrid time and frequency domain preconditioner 320 generates a preconditioned set of linear equations. Linear system solver 340 finds an approximate solution y_app for the preconditioned set of linear equations. If the approximate solution is not accurate enough (as described above), then hybrid time and frequency domain preconditioner is used again to create a second preconditioned set of linear equations based on approximate solution y_app from linear system solver 340. Then linear system solver 340 solves the second preconditioned set of linear equations. This iterative approach continues until linear system accuracy threshold LSAT is satisfied (as described above). Approximate solution x_app of the unconditioned system of linear system of equations can be computed from approximate solution y_app using a inverse preconditioning matrix. Thus, hybrid time and frequency domain preconditioner 320 and linear system solver 340 iteratively solves the set of linear equations. As described in more detail below hybrid time and frequency domain preconditioner 320 may use time domain preconditioning, which would create a time-domain preconditioned set of linear equations, or frequency domain preconditioning, which would create a frequency-domain preconditioned set of linear equations, to avoid stalling and divergence in the iterative process.

Hybrid time and frequency domain preconditioner 320 combines the benefits of time domain preconditioning techniques with the benefits of frequency domain preconditioning techniques while also reducing the negative aspects of the preconditioning techniques. For example, frequency domain preconditioning techniques are stable (i.e. does not diverge from the solution) but may require many iterations to reach the solution or may even stall so that the solution will not be reached in a reasonable amount of time. Time domain preconditioning techniques can converge rapidly to the solution but may also be unstable (i.e. may diverge from the solution). Specifically, under the control of domain switching unit 330, hybrid time and frequency domain preconditioner 320 uses time domain preconditioning techniques to achieve rapid convergence but switches to frequency domain preconditioning techniques if the time domain preconditioning techniques begins to diverge. Conversely, if the frequency domain preconditioning techniques begin to stall, hybrid time and frequency domain preconditioner 320 switches to time domain preconditioning techniques to avoid stalling. Accordingly, domain switching unit 330 monitors the progress being made at each iteration by hybrid time and frequency domain preconditioner 320. In general, domain switching unit 330 monitors the residual using approximate vector y_app. A specific embodiment of domain switching unit 330 is described in detail below. In many embodiments of the present invention, domain switching unit 330 is incorporated directly within hybrid time and frequency domain preconditioner 320.

Figure 4:
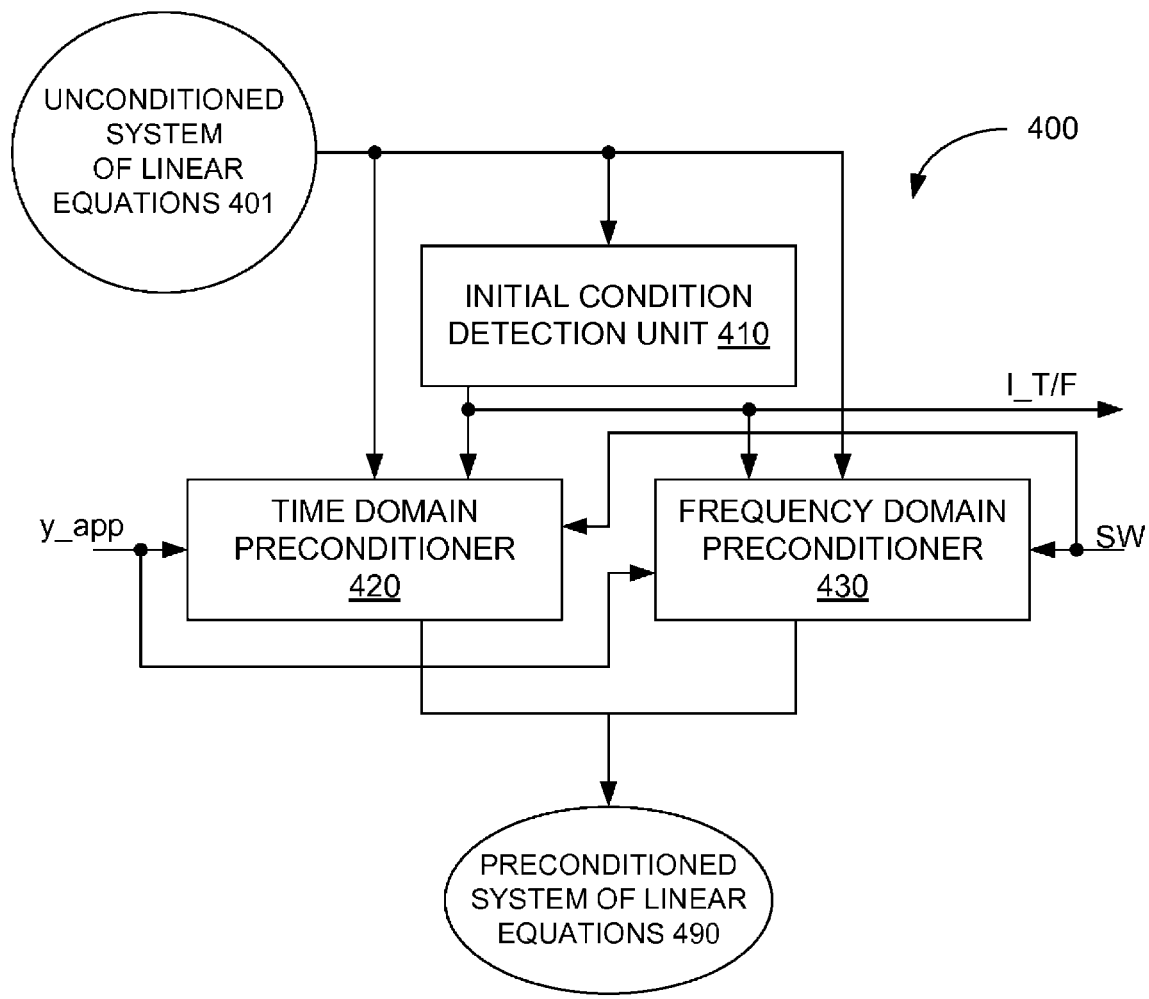
FIG. 4 illustrates a simplified design layout with sensitive spots in accordance with one embodiment of the present invention.

FIG. 4 is a block diagram of a hybrid time and frequency domain preconditioner 400, which receives an unconditioned system of linear equations 401 and generates a preconditioned system of linear equations 490, in accordance with one embodiment of the present invention. Hybrid time and frequency domain preconditioner 400 includes an initial condition detection unit 410, a time domain preconditioner 420 and a frequency domain preconditioner 440. Initial condition detection unit 410 analyzes unconditioned system of linear equations 401 to determine whether to start with time-domain preconditioning or frequency domain preconditioning. In one embodiment of the present invention initial condition detection unit 410 calculates the residual of unconditioned system of linear equations 401 to determine whether to use time domain preconditioning or frequency domain preconditioning. Specifically, if the residual is greater than an initial domain selection threshold IDST then frequency domain preconditioner 430 is enabled by driving an initial time or frequency signal I_T/F to a first logic state (i.e. logic low). Otherwise, time domain preconditioner 420 is enabled by driving initial time or frequency signal I_T/F to a second logic state (i.e. logic high). In one embodiment of the present invention, initial domain selection threshold IDST is equal to 1.0. Initial condition detection unit 410 is used only for the initial iteration for solving unconditioned system of linear equations 401. After the first iteration, domain switching unit 330 (FIG. 3) controls whether time domain preconditioner 420 or frequency domain preconditioner 430 is enabled using a switch signal SW.

Conventional time domain preconditioners and conventional frequency domain preconditioners can be used in some embodiments of the present invention. In other embodiments time domain preconditioner 420 and frequency domain preconditioner may be partially merged to be able to share resources. In a particular embodiment of the present invention, if time domain preconditioner 420 receives a frequency domain vector (e.g. after hybrid time and frequency domain preconditioner 400 switches from using frequency domain to time domain), time domain preconditioner 420 first performs an inverse Discrete Fourier Transform (DFT) on the frequency domain vector. Then, time domain preconditioner 420 builds a backward Euler time domain discretization matrix, which is split into an upper right block U (often called the periodicity block) and the remainder of the matrix L. The preconditioned system of linear equations is expressed in equation EQ1.

$$(I+\text{inv}(L)*U)*x=\text{inv}(L)*b \qquad \text{EQ1}$$

where I is the identity matrix, inv(L) is the inverse of L, and b is the right hand side vector of linear equations 401 expressed as (A*x=b). A Krylov Solver, such as the generalized minimal residual method (GMRES)) can be used with equation EQ1 to solve for the last n components of the solution vector x of systems of linear equations 401. Once the last n components of x are computed, the remainder of the x components are calculated as follows:

$$L*x=b-U*x(n) \qquad \text{EQ2}$$

Where x(n) are the last n components of the solution x.
Applying a discrete Fourier transform on vector x converts vector x into the frequency domain.

In most embodiments of the present invention the frequency domain preconditioner used in the Hybrid approach assumes that the Capacitance and Conductance matrices of the system are constant with respect to time. Therefore the preconditioner looks like the following matrix:

$$\begin{vmatrix} 2j\pi(-(k))fC+G & 0 & 0 & \cdots & 0 \\ 0 & 2j\pi(-(k-1))fC+G & 0 & \cdots & 0 \\ 0 & 0 & 2j\pi(-(k-2))fC+G & \cdots & 0 \\ \cdots & \cdots & \cdots & \cdots & \cdots \\ 0 & 0 & 0 & \cdots & 2j\pi((k))fC+G \end{vmatrix}$$

Where f is the fundamental frequency of the system.

As explained above, domain switching unit 330 controls whether hybrid time and frequency domain preconditioner 320 uses time domain preconditioning techniques or frequency domain preconditioning techniques. Specifically, domain switching unit 330 causes hybrid time and frequency domain preconditioner 320 to switch from time domain to frequency domain when the approximate solution vector begins to diverge from the desired solution. In some embodiments of the present invention divergence is detected when the residual of the current approximate solution (y_app) minus the residual of the previous approximate solution is greater than a time domain divergence threshold TDDT. In a particular embodiment of the present invention time domain divergence threshold TDDT is equal to 1e12.

If the linear system solver stalls so that convergence would not occur in a reasonable time or at all, domain switching unit 330 causes hybrid time and frequency domain preconditioner 320 to switch from frequency domain to time domain. In some embodiments of the present invention, stalls are detected using a stall detection ratio SDR, a stall detection threshold SDT, and a stall occurrence threshold SOT. Specifically, a stall is defined to occur if the residual of the current approximate solution divided by the residual of the previous approximate solution is greater than stall detection ratio SDR for a number of consecutive iterations greater than or equal to stall detection threshold SDT. Switching occurs if the number of stalls is greater than or equal to stall occurrence threshold SOT. In a particular embodiment of the present invention, stall detection ratio SDR is equal to 0.95, stall detection threshold SDT is equal to 10, and stall occurrence threshold SOT is equal 3.

Thus, harmonic balance systems in accordance with the present invention are better able to simulate PLL sub-block by selectively switching between time domain preconditioning and frequency domain preconditioning of the unconditioned system of linear equations used to solve the system of non-linear equations. Specifically a hybrid time and frequency domain preconditioner switches from time domain to frequency domain when time domain preconditioning begins to cause divergence. Furthermore, the hybrid time and frequency domain preconditioner switches from time domain to frequency domain when the frequency domain preconditioning stalls.

Generally, the present invention is likely to be implemented on a computer as part of an EDA package. The computer programmed in accordance with the invention receives a design of an integrated circuit device. Then, with appropriate parameters (e.g. thresholds and ratios) from the user, the PLLs can be quickly simulated.

The data structures and software code for implementing one or more acts described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet. In one embodiment, the carrier wave includes computer instruction signals for carrying out the process described above.

Numerous modifications and adaptations of the embodiments described herein will become apparent to the skilled artisan in view of this disclosure and are encompassed by the scope of the invention.

What is claimed is:

1. A method of simulating phase noise in a circuit, the method comprising:
    constructing an unconditioned system of linear equations based on a system of non-linear equations;
    generating a first plurality of time-domain preconditioned systems of linear equations;
    generating a time-domain preconditioned approximate solutions for each time-domain preconditioned system of linear equations to form a first plurality of time-domain preconditioned approximate solutions;
    generating a first plurality of frequency-domain preconditioned systems of linear equations;
    generating a frequency-domain preconditioned approximate solutions for each frequency-domain preconditioned system of linear equations to form a first plurality of frequency-domain preconditioned approximate solutions;
    determining whether to use the first plurality of time-domain preconditioned approximate solutions or the first plurality of frequency-domain preconditioned approximate solutions to generate an unconditioned approximate solution to the unconditioned system of linear equations;
    generating the unconditioned approximate solution to the unconditioned system of linear equations based on the determination; and
    generating an approximate solution to the system of non-linear equations based on the generated unconditioned approximate solutions.

2. The method of claim 1, wherein the first plurality of time-domain preconditioned systems of linear equations includes a first time-domain preconditioned system of linear equations generated from the unconditioned system of linear equations.

3. The method of claim 2,
    wherein the first plurality of time-domain preconditioned systems of linear equations includes a last time-domain preconditioned system of linear equations; and
    wherein the plurality of frequency-domain preconditioned systems of linear equations includes a first frequency-domain preconditioned system of linear equations generated from the last time-domain preconditioned system of linear equations.

4. The method of claim 1, wherein the first plurality of frequency-domain preconditioned systems of linear equations includes a first frequency-domain preconditioned system of linear equations generated from the unconditioned system of linear equations.

5. The method of claim 4,
    wherein the first plurality of frequency-domain preconditioned systems of linear equations includes a last frequency-domain preconditioned system of linear equations; and
    wherein the first plurality of time-domain preconditioned systems of linear equations includes a first time-domain preconditioned system of linear equations generated from the last time-domain preconditioned system of linear equations.

6. The method of claim 1, further comprising calculating a residual of the unconditioned system of linear equations.

7. The method of claim 6, wherein the generating the first plurality of time-domain preconditioned systems of linear equations occurs before generating the first plurality of frequency-domain preconditioned systems of linear equations when the residual of the unconditioned system of linear equations is less than an initial domain selection threshold.

8. The method of claim 6, wherein generating the first plurality of frequency-domain preconditioned systems of linear equations occurs before the generating the first plurality of time-domain preconditioned systems of linear equations when the residual of the unconditioned system of linear equations is greater than an initial domain selection threshold.

9. The method of claim 1, wherein determining whether to use the first plurality of time-domain preconditioned approximate solutions or the first plurality of frequency-domain preconditioned approximate solutions to generate an unconditioned approximate solution to the unconditioned system of linear equations comprises:
    detecting one or more stalls in the first plurality of frequency domain approximate solutions.

10. The method of claim 9, further comprising:
    selecting the first plurality of time-domain preconditioned approximate solutions responsive to a number of stalls being greater than or equal to a stall occurrence threshold.

11. The method of claim 10, wherein a stall is detected when a residual of a current frequency-domain preconditioned approximate solution divided by a residual of a previous frequency-domain preconditioned approximate solution is greater than a stall detection ratio for greater than a stall detection threshold number of iterations.

12. The method of claim 1, wherein determining whether to use the first plurality of time-domain preconditioned approximate solutions or the first plurality of frequency-domain preconditioned approximate solutions to generate an unconditioned approximate solution to the unconditioned system of linear equations comprises:

detecting a divergence in the first plurality of frequency domain approximate solutions.

13. The method of claim 12, further comprising:

selecting the first plurality of frequency-domain preconditioned approximate solutions responsive to detecting the divergence.

14. The method of claim 13, wherein the divergence is detected when a residual of a current frequency-domain preconditioned approximate solution minus a residual of a previous frequency-domain preconditioned approximate solution is greater than a time domain divergence threshold.

15. The method of claim 1, further comprising:

generating a second plurality of time-domain preconditioned systems of linear equations after generating the first plurality of frequency-domain preconditioned systems of linear equations.

16. The method of claim 1, further comprising:

generating a second plurality of frequency-domain preconditioned systems of linear equations after generating the first plurality of time-domain preconditioned systems of linear equations.

17. A non-transitory computer-readable storage medium encoded with instructions for simulating phase noise of a circuit, the instructions when executed by a processor are configured to:

construct an unconditioned system of linear equations based on a system of non-linear equations;
  generate a first plurality of time-domain preconditioned systems of linear equations;
  generate a time-domain preconditioned approximate solutions for each time-domain preconditioned system of linear equations to form a first plurality of time-domain preconditioned approximate solutions;
  generate a first plurality of frequency-domain preconditioned systems of linear equations;
  generate a frequency-domain preconditioned approximate solutions for each frequency-domain preconditioned system of linear equations to form a first plurality of frequency-domain preconditioned approximate solutions;
  determine whether to use the first plurality of time-domain preconditioned approximate solutions or the first plurality of frequency-domain preconditioned approximate solutions to generate an unconditioned approximate solution to the unconditioned system of linear equations;
  generate the unconditioned approximate solution to the unconditioned system of linear equations based on the determination; and
  generate an approximate solution to the system of non-linear equations based on the generate unconditioned approximate solutions.

18. A system of simulating phase noise in a circuit, the system comprising:

a processor;
  a computer-readable storage medium comprising executable code, the code when executed by the processor are configured for:
    constructing an unconditioned system of linear equations based on a system of linear equations;
    generating a first plurality of time-domain preconditioned systems of linear equations;
    generating a time-domain preconditioned approximate solutions for each time-domain preconditioned system of linear equations to form a first plurality of time-domain preconditioned approximate solutions;
    generating a first plurality of frequency-domain preconditioned systems of linear equations;
    generating a frequency-domain preconditioned approximate solutions for each frequency-domain preconditioned system of linear equations to form a first plurality of frequency-domain preconditioned approximate solutions;
    determining whether to use the first plurality of time-domain preconditioned approximate solutions or the first plurality of frequency-domain preconditioned approximate solutions to generate an unconditioned approximate solution to the unconditioned system of linear equations;
    generating the unconditioned approximate solution to the unconditioned system of linear equations based on the determination; and
    generating an approximate solution to the system of nonlinear equations based on the generated unconditioned approximate solutions.

19. The system of claim 18, wherein the code when executed by the processor is further configured for:

calculating a residual of the unconditioned system of linear equations.

20. The system of claim 18, wherein the code for determining whether to use the first plurality of time-domain preconditioned approximate solutions or the first plurality of frequency-domain preconditioned approximate solutions to generate an unconditioned approximate solution to the unconditioned system of linear equations further comprises code for:

detecting one or more stalls in the first plurality of frequency domain approximate solutions.

21. The system of claim 18, wherein the code for determining whether to use the first plurality of time-domain preconditioned approximate solutions or the first plurality of frequency-domain preconditioned approximate solutions to generate an unconditioned approximate solution to the unconditioned system of linear equations further comprises code for:

detecting a divergence in the first plurality of frequency domain approximate solutions.

* * * * *